(12) United States Patent
Ziesler et al.

(10) Patent No.: US 8,769,332 B2
(45) Date of Patent: Jul. 1, 2014

(54) REGIONAL CLOCK GATING AND DITHERING

(75) Inventors: Conrad H. Ziesler, Seattle, WA (US); John H. Mylius, Gilroy, CA (US); Jason M. Kassoff, Denver, CO (US)

(73) Assignee: Apple Inc., Cupertino, CA (US)

( * ) Notice: Subject to any disclaimer, the term of this patent is extended or adjusted under 35 U.S.C. 154(b) by 281 days.

(21) Appl. No.: 13/355,023

(22) Filed: Jan. 20, 2012

(65) Prior Publication Data

US 2013/0191677 A1     Jul. 25, 2013

(51) Int. Cl.
*G06F 1/00*     (2006.01)
*H03K 19/00*     (2006.01)

(52) U.S. Cl.
USPC .............................. 713/500; 713/322; 326/93

(58) Field of Classification Search
CPC ......................................................... G06F 1/08
USPC ....................................................... 713/500
See application file for complete search history.

(56) References Cited

U.S. PATENT DOCUMENTS

| | | | |
|---|---|---|---|
| 5,923,188 A * | 7/1999 | Kametani et al. ................ | 326/93 |
| 6,204,695 B1 * | 3/2001 | Alfke et al. ...................... | 326/93 |
| 6,232,820 B1 * | 5/2001 | Long et al. ..................... | 327/374 |
| 6,272,667 B1 * | 8/2001 | Minami et al. ................ | 716/108 |
| 6,434,704 B1 * | 8/2002 | Dean et al. ..................... | 713/320 |
| 6,536,024 B1 | 3/2003 | Hathaway | |
| 6,822,481 B1 * | 11/2004 | Srikantam et al. .............. | 326/93 |
| 6,971,038 B2 * | 11/2005 | Santhanam et al. .......... | 713/324 |
| 7,180,353 B2 * | 2/2007 | Chiu et al. .................... | 327/295 |
| 7,281,140 B2 * | 10/2007 | Burns et al. ................... | 713/300 |
| 7,797,561 B1 * | 9/2010 | Abdalla et al. ................ | 713/322 |
| 7,802,118 B1 * | 9/2010 | Abdalla et al. ................ | 713/322 |
| 7,958,483 B1 * | 6/2011 | Alben et al. .................. | 716/133 |

* cited by examiner

*Primary Examiner* — Suresh Suryawanshi
(74) *Attorney, Agent, or Firm* — Lawrence J. Merkel; Erik A. Heter; Meyertons, Hood, Kivlin, Kowert & Goetzel, P.C.

(57) ABSTRACT

A system and method for dithering a clock signal during idle times is disclosed. An integrated circuit (IC) includes a number of functional units and a clock tree. The clock tree includes a root level clock-gating circuit, a number of regional clock-gating circuits, and a number of leaf level clock-gating circuits. The root level clock-gating circuit is coupled to distribute an operating clock signal to the regional clock-gating circuits, while the regional clock-gating circuits are each configured to distribute the operating clock signal to correspondingly coupled ones of the leaf level clock-gating circuits. The IC may further include a control unit configured to monitor activity levels and indications from each of the functional units. The control unit may cause the root clock-gating circuit to dither the clock signal if the IC is idle, wherein dithering includes reducing the duty cycle and the effective frequency of the operating clock signal.

22 Claims, 7 Drawing Sheets

REGIONAL CLOCK GATING AND DITHERING

BACKGROUND

1. Technical Field

This disclosure relates to integrated circuits, and more particularly, to the control of a clock signal to circuitry implemented on an integrated circuit.

2. Description of the Related Art

Clock-gating is a power saving technique that is employed in a wide variety of integrated circuits (ICs). In an IC operable to perform clock-gating, extra hardware in the form of clock-gating logic is added to various points of a clock tree that is used to distribute a clock signal. A point of a clock tree used to distribute the clock signal directly to circuitry (e.g., flop circuits) may be referred to as a "leaf" node. Accordingly, clock-gating logic may be placed at the leaf node. The clock-gating logic of each leaf node may be coupled to receive an enable signal that, when asserted, enables the clock signal to be provided to the clock circuitry associated with that leaf node. The enable signal may be de-asserted to inhibit the clock signal from being provided to circuitry coupled to a corresponding leaf node when that circuitry is idle, thereby saving power.

Circuitry for implementing clock-gating may include logic to detect when various circuits are idle. Idle times may be defined as a specified amount of time that a given circuit or block of logic is inactive (e.g., is not processing data in some manner). One or more logic blocks may be implemented to monitor those functional blocks for which clock-gating is supported. If a functional block has been idle for a sufficient amount of time, a corresponding clock enable signal may be asserted. If another unit attempts to communicate with a clock-gated functional block while it is idle, the clock enable signal may be de-asserted, and other actions may be performed to re-start the clock signal to the previously idled functional block.

SUMMARY

A system and method for dithering a clock signal during idle times is disclosed. In one embodiment, an integrated circuit (IC) includes a number of functional units and a clock tree. The clock tree includes a root level clock-gating circuit, a number of regional clock-gating circuits, and a number of leaf level clock-gating circuits. The root level clock-gating circuit is coupled to distribute an operating clock signal to the regional clock-gating circuits, while the regional clock-gating circuits are each configured to distribute the operating clock signal to correspondingly coupled ones of the leaf level clock-gating circuits. Various ones of the functional units may include one or more regional clock-gating circuits and one or more leaf level clock-gating circuits. The IC may further include a control unit configured to monitor activity levels and other indications of each of the functional units. The control unit may cause the root clock-gating circuit to dither the clock signal if the functional units of the IC are idle or expected to be idle, wherein dithering includes reducing the duty cycle of the operational clock signal and thus reducing its effective frequency.

In one embodiment, the first idle state may be a state in which further forward progress of IC operation is not being made, but is expected to be made in the future due to some externality. One such example would be a level two (L2) cache miss in a processor. If a cache miss occurs, forward progress of the processor may be halted during the latency period in which data is accessed from the memory of the system in which the processor is implemented. Since this latency may be large relative to the processing speed, the idle time waiting for data to return from the memory may be used to save power, although it may nevertheless be desirable to keep the processor in an active state. Accordingly, instead of clock-gating the processor or functional units therein, the control unit may cause the duty cycle and effective frequency of the clock signal to be reduced. This may save power in the clock tree while allowing the various logic circuits of the processor to otherwise remain active.

BRIEF DESCRIPTION OF THE DRAWINGS

The following detailed description makes reference to the accompanying drawings, which are now briefly described.

Figure 1:
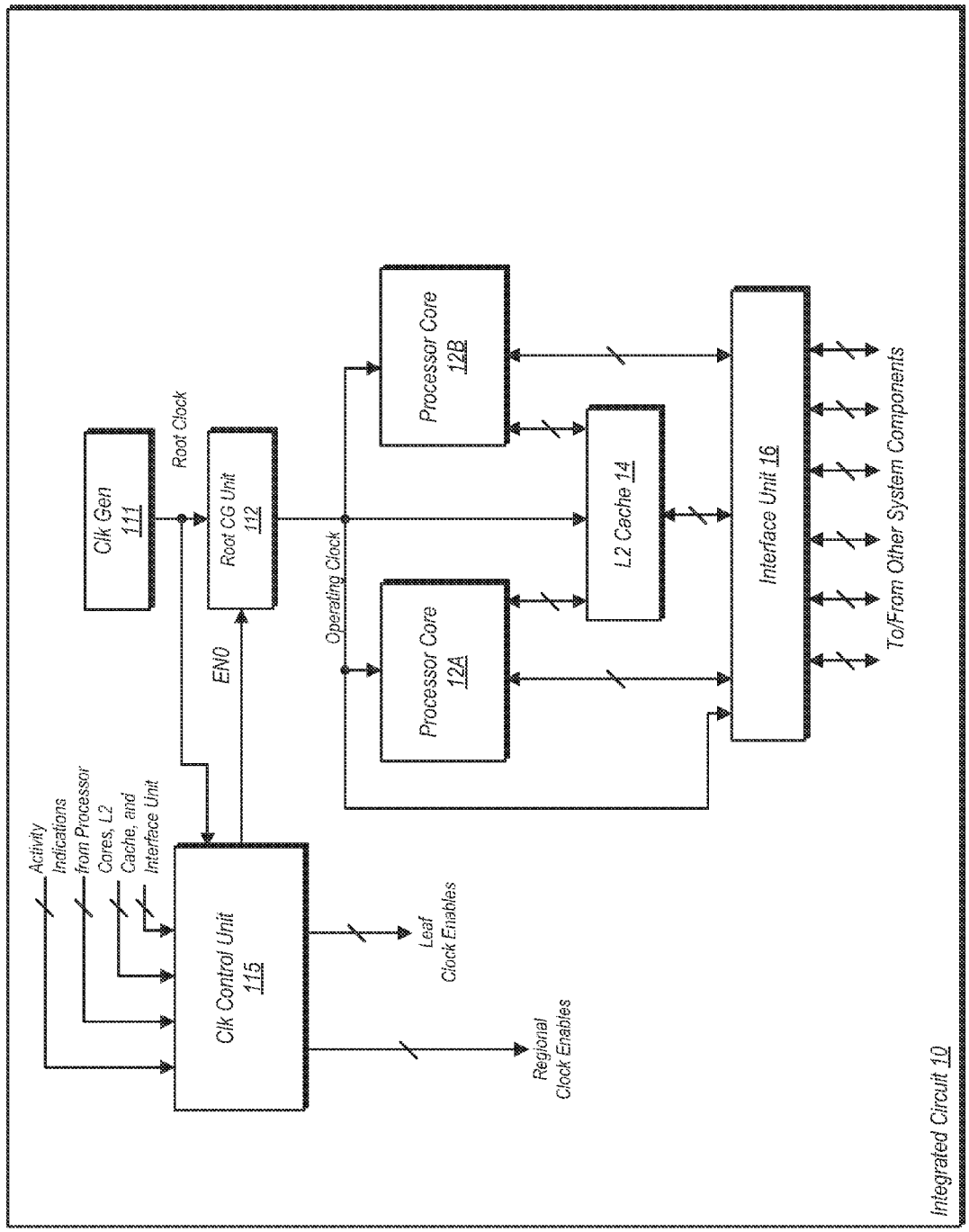
FIG. 1 is a block diagram of system including a processor having a clock tree with various levels of clock gating.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit

Turning now to FIG. 1, a block diagram of one embodiment of an integrated circuit (IC) is shown. In the embodiment shown, IC 10 is a system-on-a-chip (SOC) that includes multiple processor cores and other circuitry. It is noted that not all components of the SOC are shown here, as other functional blocks may be present. Additionally, it is noted that the discussion with respect to an SOC presented here is for the sake of example. Accordingly, other embodiments of an IC are possible and contemplated for use with the various method and apparatus embodiments disclosed herein.

In the embodiment shown, IC 10 includes processor cores 12A and 12B, a level two (L2) cache 14, and an interface unit 16. The interface unit 16 may provide an interface to a bus on the IC 10, and may additionally provide interfaces to other components, some of which may be on-chip while other such components may be off-chip. Such components may include (but are not limited to) memories, graphics circuitry, peripheral interfaces, input/output (I/O devices such as touch screens, keyboards, and/or buttons, various types of radio transceiver circuitry, and so forth. As will be discussed further below, each of processor cores 12A and 12B, L2 cache 14, and interface unit 16 may include one or more regional clock-gating (ROOT CG) units and may also include a number of leaf level clock-gating (LLCG) units for gating the operating clock signal at lower levels of a clock tree. An exemplary clock tree will be discussed in reference to FIG. 2.

In one embodiment, each processor cores 12A and 12B are substantially identical processor cores. In such embodiments, each of processor cores 12A and 12B may include level one (L1) instruction and data caches, and various types of logic to support the execution of instructions of an instruction set (e.g., execution units, schedulers, and so on). In contrast to the shared L2 cache 14, the L1 caches of each of processor cores 12A and 12B are not shared.

L2 cache 14 in the embodiment shown may store both instructions and data that may be accessed by either one of processor cores 12A and 12B. L2 cache 14 may be implemented as any one of a direct mapped cache, a set-associative cache, or a fully associative cache. Furthermore, L2 cache 14 may be implemented with any suitable number of ways. In addition to including a number of storage locations, L2 cache 14 may include supporting logic circuitry to enable access to the various storage locations. Such circuitry may include address decoders, sense amplifiers (for reads), drivers (for writes), read and write ports, and circuitry for enabling/disabling read and write operations.

Processor cores 12A and 12B, L2 cache 14, and interface unit 16 in the embodiment shown are each coupled to receive an operating clock signal from root clock-gating (root CG) unit 112. The operating clock signal provided by root CG unit 12 in the embodiment shown is based on a root clock signal generated by clock generator 111. In various embodiments, clock generator 111 may be a phase locked loop (PLL), an oscillator, or any other suitable type of clock generation circuitry. In one embodiment, clock generator 111 may provide the root clock signal at a specified frequency and at a 50% duty cycle.

Root CG unit 112 in the embodiment shown is coupled to receive an enable signal, EN0, from clock control unit 115. When the enable signal is asserted, root CG unit 112 may allow the root clock signal to pass from its input to its output, thus providing the root clock signal as the operating clock signal (i.e. at the same frequency and duty cycle). When the enable signal is not asserted, root CG unit 14 may inhibit the passing of the root clock signal such that no operational clock is provided. Furthermore, clock control unit 115 in some situations may cause dithering of the operating clock signal by periodically asserting and de-asserting the enable signal. Dithering the operating clock signal may be defined as enabling and disabling root CG unit 112 such that the root clock signal is passed through only once every N cycles. By periodically asserting (one of every N cycles of the root clock signal) and de-asserting (for N−1 of every N cycles of the root clock signal) the enable signal, the operating clock signal may be provided at a duty cycle and effective frequency that are lower than the full duty cycle and frequency of the root clock signal.

Clock dithering may reduce the amount of clock power consumed by a clock tree implemented in IC 10, while allowing the functional units discussed above to remain active. This may be useful in certain situations where these units are idle, but are expected to be active at some point. For example, consider a case where a request for data has resulted in both an L1 cache miss and an L2 cache miss. In such cases, the requested data may be accessed either from a main memory of the system in which IC 10 is implemented, or from hard storage (e.g., from a hard disk, flash storage, or other type of non-volatile storage). The latency time for such accesses may be long relative to the time required for an L1 or L2 cache access. Accordingly, it is possible that no forward processing progress can be made until the request is satisfied by providing the data to at least one of processor cores 12A and 12B. In such cases, it may be desirable to save clock tree power. However, it is also desirable that at least one of processor cores 12A and 12B, L2 cache 14, and interface unit 16 remain active. Accordingly, instead of fully gating the root clock signal (thus fully inhibiting the operating clock signal), clock control unit 115 may periodically assert the enable signal (e.g., for 1 of every N cycles of the root clock signal) in order to provide the operating clock signal at a reduced effective frequency. This may allow processor cores 12A and 12B, L2 cache 14, and interface unit 16 to remain in an active state while saving power in the clock tree.

The example given above is one possible example of a situation where it may be advantageous to reduce power consumption in the clock tree while the functional blocks receiving the operating clock signal otherwise remain active. Other such situations may include (but are not limited to) communication with peripheral devices and other system components. It may also be desirable to perform clock dithering after a certain period of inactivity of each of processor cores 12A and 12B, L2 cache 14, and interface unit 16, as a prelude to entering additional low power states. For example, if each of processor cores 12A and 12B, L2 cache 14, and interface unit 16 has been inactive for a specified time period, clock control unit 115 may cause dithering of the operating clock signal in a first low power state. If these units remain inactive for another specified time period subsequent to beginning clock dithering, clock control unit 115 may fully gate the root clock, thus inhibiting the operating clock signal. As defined herein, fully gating the root clock signal and fully inhibiting the operating clock signal may be defined as an operating state in which the clock control unit 115 does not assert the enable signal, but rather holds it in a de-asserted state indefinitely. Such an operating state may be terminated by a request from sent another system component through interface unit 16, which may cause the generation of a wakeup signal within clock control unit 115.

In the embodiment shown, clock control unit 115 is coupled to receive activity indications from each of processor cores 12A and 12B, L2 cache 14, and interface unit 16. Clock control unit 115 may use these various indications to determine when clock dithering and clock-gating are appropriate. Using as one example that which was presented above, clock control unit 115 may receive an indication of an L2 cache miss (and a initiation of a memory access) from L2 cache 14. Clock control unit 115 may use this information to determine whether additional forward progress can be made by either of processor cores 12A and 12B or if there is any additional work to be performed by interface unit 16 prior to the requested data being returned from memory. If clock control unit 115 determines that no additional forward progress can be made until the requested data is returned from memory, it may cause dithering of the operating clock signal. Clock control unit 115 may restore the operating clock signal to its full frequency and duty cycle (e.g., equal to those of the root clock signal) when the requested data is received by interface unit 16. The restoration of the full frequency and duty cycle may occur without delay and at any point in the cycle of the dithered operating clock signal.

In addition to dithering the operating clock signal at root CG unit 112, clock control unit 115 may also perform clock-gating at regional and leaf levels of the clock tree. In the embodiment shown, clock control unit 115 is configured to generate and provide a number of different regional and leaf level clock enable signals. These signals, when asserted, may allow the operating clock to pass. In the case of the regional clock-gating units (to be discussed below), the operating clock may be allowed to pass to leaf nodes of the clock tree when its respectively received enable signal is asserted. Each of the leaf nodes may include a leaf level clock-gating unit. In the case of the leaf level clock-gating units, assertion of a respectively received enable signal may allow the operating clock signal to pass directly to correspondingly coupled clock consumers (e.g., synchronous circuits that utilize the operating clock signal). Clock control unit 115 may selectively enable or disable various ones of the clock-gating units (regional or leaf level) based on indications received from the functional units in which they are implemented. This may provide some clock power savings in the clock tree when the operating clock is enabled or otherwise dithered. The indications may include indications of a specified period of idle time for clock consumers coupled to a leaf level clock-gating unit. An enable signal provided to a regional clock-gating unit may be de-asserted if it is determined that all of its correspondingly coupled leaf level clock-gating circuits are disabled or if the corresponding clock consumers have all been idle for at least a specified time period.

Additional details of one embodiment of a clock tree will now be discussed in further detail with reference to FIG. 2, followed by discussion of one embodiment of clock control unit 115 with reference to FIG. 3.

Figure 2:
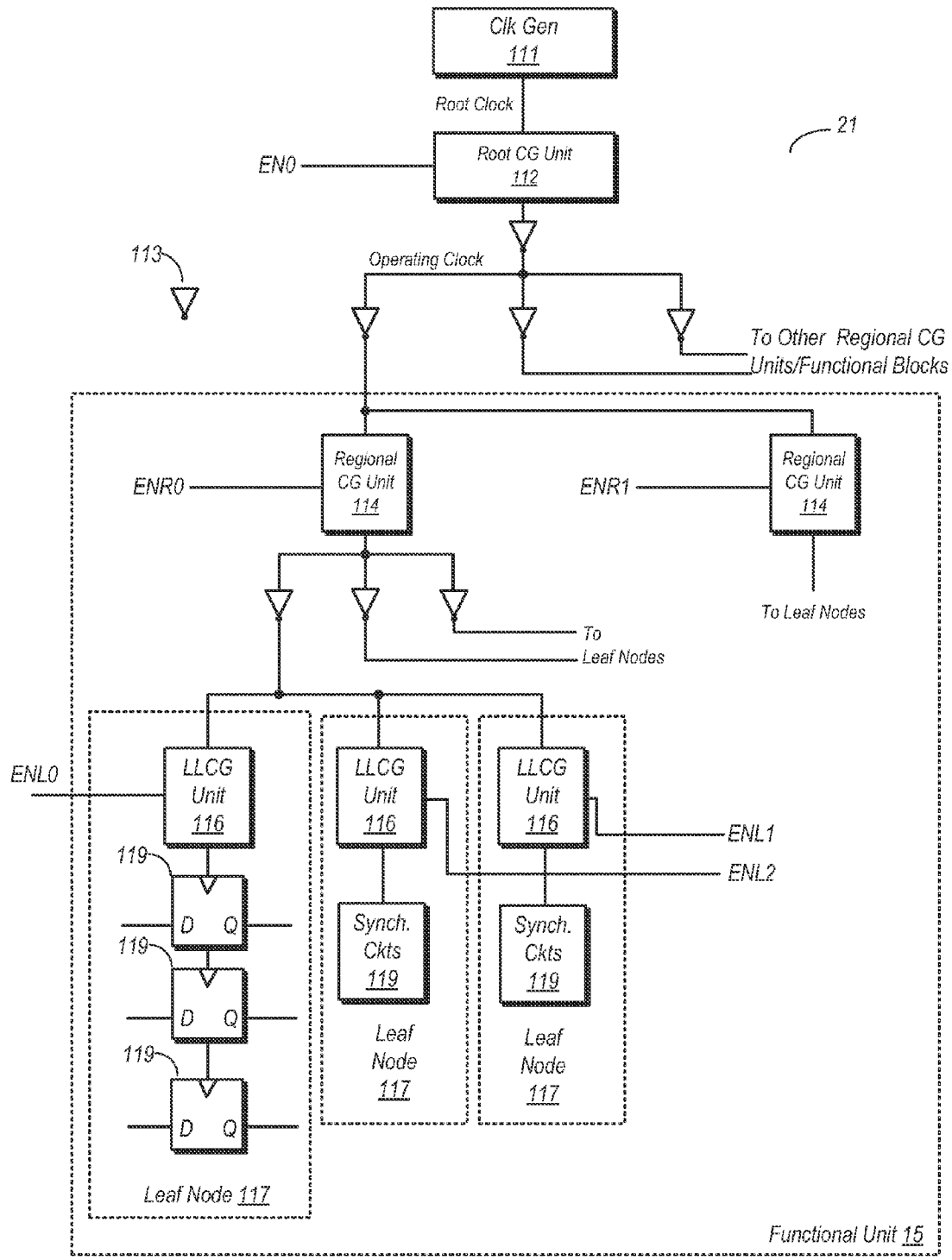
FIG. 2 is a diagram further illustrating one embodiment of a clock tree.

Clock Tree:

Turning now to FIG. 2, a diagram illustrating one embodiment of a clock tree that may be implemented in IC 10 is shown. In the illustrated embodiment, clock tree 21 includes a clock generator 111 configured to generate a root clock signal that is conveyed to the root CG unit 112. Clock generator 111 may be any suitable type of clock generating circuit, such as a phase locked loop (PLL) or a ring oscillator. Root CG unit 112 may receive the root clock signal and output a corresponding operating clock signal via a clock driver 113 (which may be an inverter or a non-inverting buffer). As previously noted, root CG unit 112 may provide the operating clock signal when the enable signal is asserted. When the enable signal is de-asserted, root CG unit 112 may inhibit the operating clock signal (that is, the clock signal may be held to a single logic state). As further noted above, clock control unit 115 may periodically assert and de-assert the enable signal in order to dither the operating clock signal.

The operating clock signal may be distributed, via additional instances of clock driver 113, to various instances of a regional CG unit 114. Each regional clock-gating unit 114 is coupled to output a respective clock signal to a corresponding instance of functional unit 15. Only one instance of functional unit 15 is shown here for the sake of simplicity, although others may be present. Functional unit 15 may correspond to one of the various units discussed above (e.g., to processor core 12A or 12B), or to another type of functional unit in another IC embodiment.

The operating clock signal output by each regional CG unit 114 may be provided to, via another clock driver 113, to a number of different leaf nodes 117 in each of functional units 115. Each of the leaf nodes 117 includes a leaf level CG unit 116 and one or more synchronous circuits 119. The synchronous circuits 119 may include flip-flops, latches, and/or other types of circuits that operate in accordance with a clock signal.

Each leaf level CG unit 116 may have as few as one synchronous circuit 119 coupled thereto. Each of the leaf level CG units 116 may also receive a corresponding enable signal (e.g., EN0), each of which may be asserted and de-asserted independent of the others. Clock control unit 112 may inhibit a clock from being provided to the synchronous circuits 119 of any leaf node 117 by de-asserting the corresponding enable signal (e.g., ENL0, ENL1, etc). This may enable fine grain power savings. When a given enable signal is asserted, its corresponding leaf level CG 116 may allow the clock signal to be provided to the synchronous circuits 119 coupled thereto. Although not explicitly shown, functional unit 15 may include performance-monitoring circuitry coupled to each of the leaf nodes and configured to determine if its corresponding synchronous circuits 119 are active or inactive. This information may be provided with the activity indications as discussed above.

As previously noted, clock tree 21 may include a number of clock drivers 113 in the various clock distribution branches, which are shown here as inverters. Embodiments in which non-inverting buffers are used instead of inverters are possible and contemplated. In either case, the use of the inverters/buffers may be used to control the skew of the clock signals distributed among the various leaf nodes 117 so that the clock edges are substantially aligned from one leaf node 117 to the next, as well as from one functional unit 15 to the next.

Figure 3:
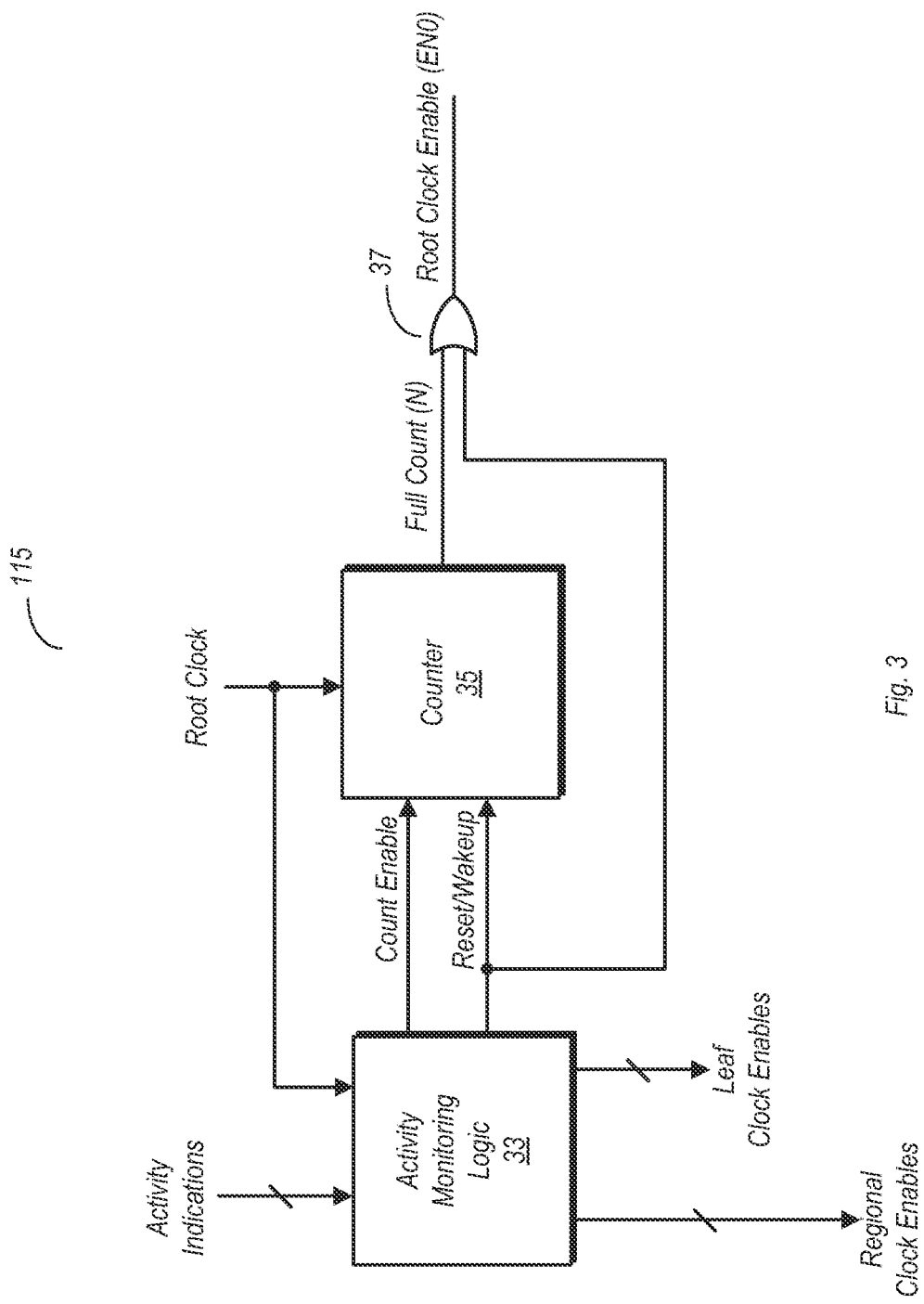
FIG. 3 is a block diagram illustrating one embodiment of a clock control unit.

Exemplary Clock Control Unit:

FIG. 3 is a block diagram illustrating one embodiment of a clock control unit. In the embodiment shown, clock control unit 115 includes activity monitoring logic 33, counter 35, and a logic gate 37 (implemented here as an OR gate). As illustrated in FIG. 1, clock control unit 115 may be coupled to provide the root clock enable signal to root CG unit 112. The root clock enable signal may be asserted to enable root CG unit 112 in order to enable the operating clock, and de-asserted to inhibit the operating clock signal. As noted above, clock control unit 115 may also cause dithering of the operating clock signal by periodically asserting and de-asserting the root clock enable signal.

In the embodiment shown, activity monitoring logic 33 is coupled to receive activity indications from various circuits distributed within IC 10. The activity indications may include indications of a current activity level of the reporting circuits, including indications of whether those circuits are currently idle. Activity indications may also include indications of such events as a cache miss and a correspondingly initiated memory access, requests for communication with various peripherals and/or I/O devices, and so on. Additionally, devices external to IC 10 may provide additional activity indications to activity monitoring logic 33. For example, an input device external to IC 10 may provide an indication of a user input to an input device such as a touch screen.

Using the various activity indications received, activity monitoring logic 33 may determine when it is appropriate to gate the operating clock and at which levels such gating is appropriate. For example, activity monitoring logic 33 may determine that some circuitry coupled to a particular leaf level CG unit 16 may have been inactive for a predetermined time period, and may thus de-assert a corresponding enable signal. This may cause the operating clock to be inhibited by the corresponding leaf level CG unit 16. Other leaf level CG units 116 coupled to the same regional CG unit 114 may nonetheless remain enabled if their correspondingly coupled circuits are active. If activity monitoring logic 33 determines that the circuitry associated with all leaf nodes associated with a given regional CG unit 114 are inactive, it may de-assert the corresponding regional clock enable signal. If gating has been performed for all of the regional CG units 114, activity monitoring logic 33 may cause the de-assertion of the root clock enable signal in order to cause gating at the root clock level of the clock tree.

As previously noted, clock control unit 115 may also cause dithering of the operating clock signal by periodically enabling and disabling the root CG unit 112. In the embodiment shown, clock control unit 115 includes a counter 35 coupled to receive the root clock signal. Additionally, counter 35 is coupled to receive a reset/wakeup signal and a count enable signal from activity monitoring logic 33. When the root clock enable signal is to be unconditionally asserted to provide the operating clock signal at its full frequency and duty cycle, activity monitoring logic 33 may assert the reset/wakeup signal. Assertion of the reset/wakeup signal may hold counter 35 in a reset state. The assertion of the reset/wakeup signal may also cause OR gate 35 to assert the root clock enable signal. When clock dithering is to be performed, activity monitoring logic 33 may de-assert the reset/wakeup signal while asserting the count enable signal. When the count enable signal is asserted and the reset/wakeup signal is de-asserted, counter 35 may begin counting. The counting performed by counter 35 is synchronized to the root clock signal in the embodiment shown. When the counter reaches its full count (equivalent to an integer value of N), the full count signal may be asserted and held asserted for a time equivalent to one period of the root clock signal. Assertion of the full count signal may occur responsive to the rising edge of the root clock signal on the cycle that counter 35 reaches its full count. When asserted, the full count signal may thus cause OR gate 37 to assert the root clock enable signal. When the root clock signal falls low, the full count signal may also fall low. Counter 35 may then begin counting from a value of zero up until a value of N, at which time the full count signal is asserted again. This cycle may continue repeating as long as activity monitoring logic 33 holds the reset/wakeup signal de-asserted and the counter enable signal asserted.

Exiting clock dithering and restoring the operating clock signal to its full frequency and duty cycle may occur responsive to certain indications received by activity monitoring logic 33. For example, an external peripheral may assert an interrupt request that may invoke an interrupt handler to be executed by one of processor cores 12A or 12B. Responsive to such a received indication, activity monitoring logic may de-assert the count enable signal and assert the reset/wakeup signal at any point during the cycle of the dithered operating clock signal. This may cause the restoration of the operating clock signal to its full frequency and duty cycle without waiting for the current cycle of the dithered operating clock signal to repeat.

Full gating of the operating clock signal at the root clock level may occur when activity monitoring logic 33 de-asserts both of the count enable and reset/wakeup signals. In such a case, the root clock enable signal may be correspondingly de-asserted. Exiting the clock gated state at the root clock level may occur responsive to an indication similar to one that would also cause an exit of the dithered state.

Figure 4:
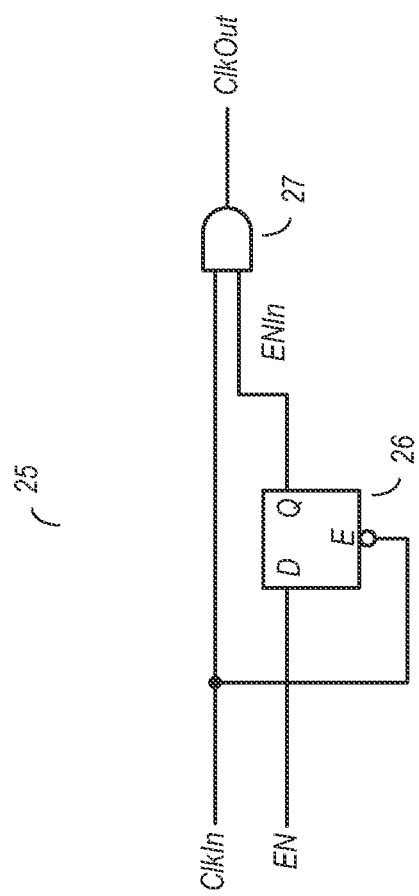
FIG. 4 is a diagram illustrating one embodiment of a clock gating circuit.

Exemplary Clock-Gating Unit:

FIG. 4 is a logic diagram of one embodiment of a clock-gating unit. The configuration of clock-gating unit 25 shown in FIG. 4 may be used to implement any of the clock-gating units discussed above. However, it is noted that in some embodiments, the various levels of clock-gating units may be implemented using different configurations.

Clock-gating unit 25 in the embodiment shown includes a latch 26 and an AND gate 27. Latch 26 in the embodiment shown is a level-sensitive latch that is coupled to receive the enable signal ('EN') on its 'D' input and the input clock signal ('CikIn') on its 'E' input. In the embodiment shown, latch 26 is transparent when the input clock signal is low. The output of latch 26 is a synchronized enable signal ('EnIn') that is provided as the second input to AND gate 27. When the synchronized enable signal provided to AND gate 27 is high, the output of clock-gating unit 25 (from AND gate 27) follows the state of the input clock signal. Otherwise, the output clock signal is low.

It is noted that the configuration of clock-gating unit 25 shown in FIG. 4 is only one of a number of possible configurations for clock-gating circuits. For example, a clock-gating circuit utilizing a passgate that is turned on or off according to an enable signal is possible and contemplated, with the clock signal passing through when the enable signal is asserted. In another embodiment, a simple AND gate without a latch is possible and contemplated for use as a clock-gating circuit.

Figure 5:
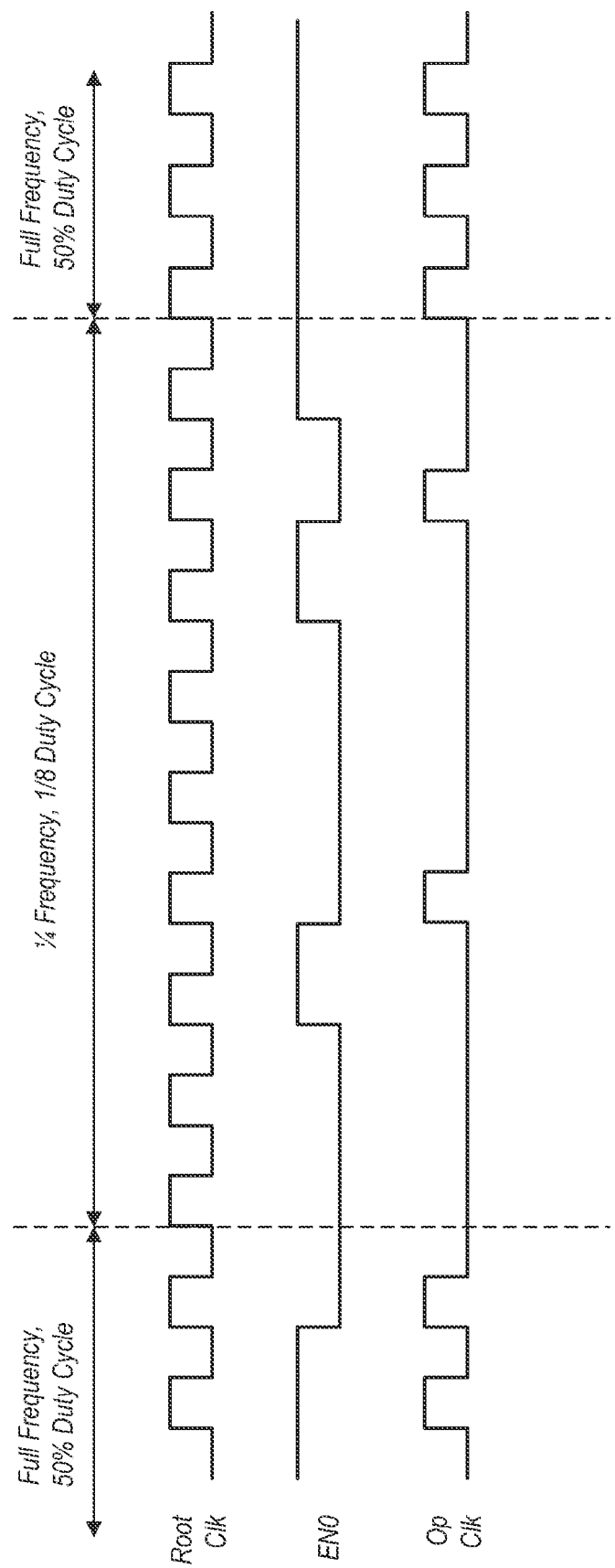
FIG. 5 is a timing diagram illustrating the use of dithering to change the duty cycle and effective frequency of a clock signal.

Timing Diagram:

FIG. 5 is a timing diagram that illustrates the use of the clock-gating unit to dither an operating clock signal. More particularly, FIG. 5 illustrates an entry into the dithering mode, the dithering of the operating clock, and the exit from the dithering state and return to the normal full frequency and duty cycle operation.

On the left-hand side of the diagram, the root clock enable signal ('EN0') is held asserted. In such a case, the operating clock signal ('Op Clk') follows the root clock signal ('Root Clk'), and has the same frequency and duty cycle (50% in this case).

Moving to the next section of the timing diagram, the operating clock signal is dithered by holding the root clock enable signal low for three of every four cycles of the root clock signal. At the beginning of the third root clock cycle, the root clock enable signal is asserted and held for a full period of the root clock signal. Thus, on the fourth period of the root clock signal, the operating clock signal transitions high. The operating clock signal also falls low with the root clock signal. Since the root clock enable signal has fallen low by this time, the operating clock signal also remains low until after the next assertion of the root clock enable signal. This cycle may be repeated as long as the root clock enable signal is cycled in accordance with the timing diagram.

The frequency of the dithered operating clock signal in this example is ¼ that of the input clock signal, while the duty cycle is ⅛. In general, for a given value of N, when the clock enable signal provided to a clock gating unit may be provided at a duty cycle of 1/N to produce a clock signal having an effective frequency of 1/N of the base frequency. The duty cycle of the reduced clock frequency signal may be ½N.

Exiting the dithering state and restoring the operating clock signal to its full frequency and duty cycle (e.g., the same as the root clock signal in this example) may be accomplished by re-asserting and holding asserted the root clock enable signal. As illustrated in the example shown, the resumption of the operating clock signal to its full frequency/duty cycle may occur at any point within a cycle of the dithered operating clock. Thus, when the enable signal is re-asserted to terminate dithering of the operating clock, it is not necessary to wait until the current cycle of the dithered operating clock is complete.

It is noted that the illustrated example is directed to only two clock frequencies, the full frequency and the reduced frequency that is ¼ that of the full frequency. However, embodiments are possible and contemplated where additional clock frequencies are possible. For example, a clock control unit could allow the output clock signal to cycle at the full frequency, at ½ the full frequency (by asserting the enable signal one of every two clock cycles) or ¼ the frequency as shown. In one embodiment, this is accomplished through the use of a programmable counter in which the full count value (and thus the value of N) may be varied.

Figure 6:
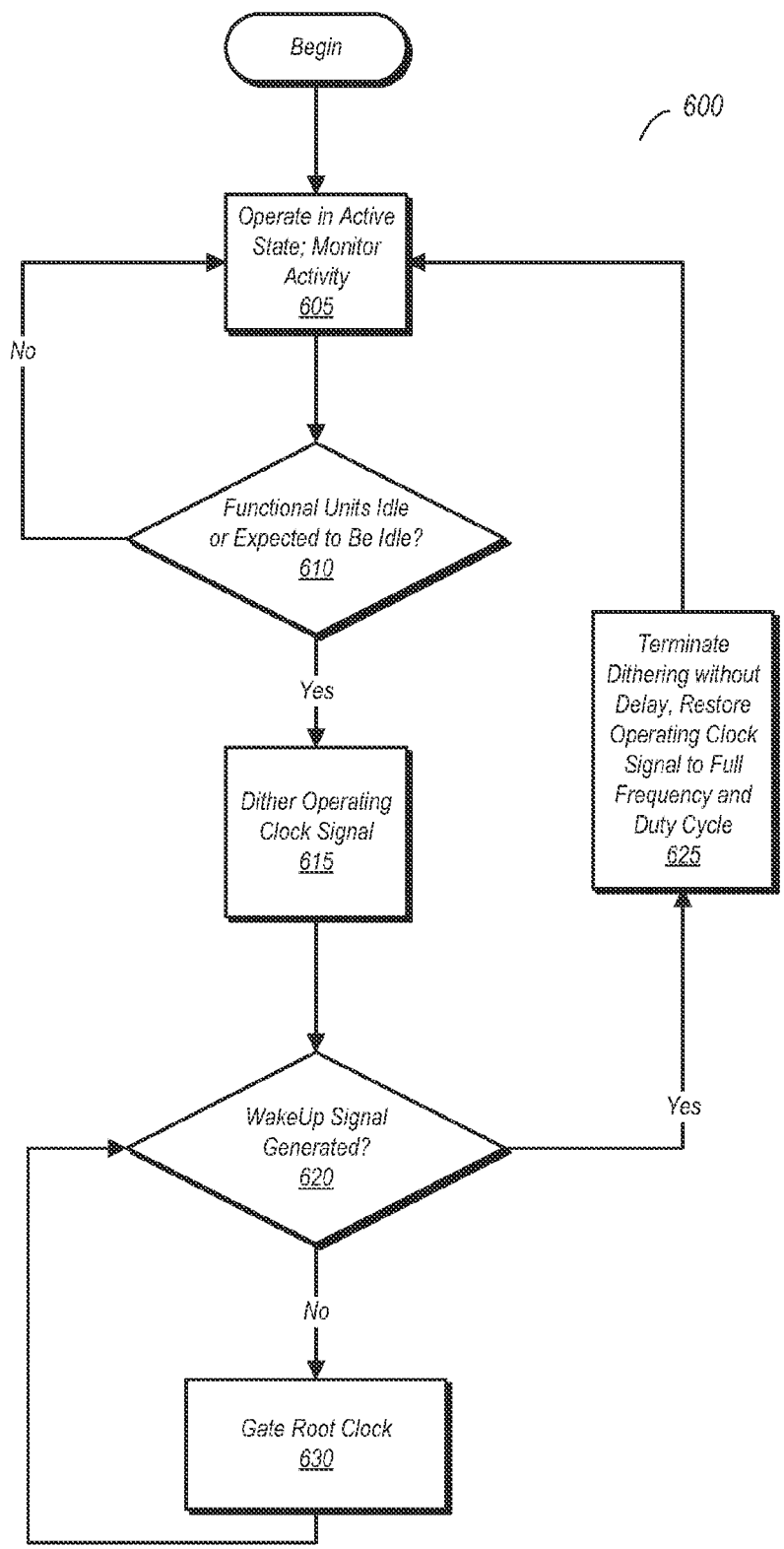
FIG. 6 is a flow diagram illustrating one embodiment of a method for dithering a clock signal.

Method Flow Diagram:

FIG. 6 is a flow diagram of one embodiment of a method for dithering and gating a clock signal. Method 600, in one embodiment, may be implemented using various embodiments of the hardware discussed above. Implementation of method 600 using other hardware embodiments not explicitly discussed herein as well as in embodiments that also utilize software or firmware are also possible and contemplated.

Method 600 begins with the operation of an IC in an active state, with activity of the IC being monitored (block 605). The active state may include providing an operating clock signal at a full frequency and full duty cycle. In some embodiments, including those discussed above, the full frequency and duty cycle of the operating clock signal may be the same as those of a root clock signal on which the former is based.

If the functional units of the IC remain active and are not expected to be idle (block 610, no), operation may continue in the active state. However, if the functional units of the IC are determined to be idle or are expected to be idle for a certain time (block 610, yes), then the operating clock signal may be dithered (block 615). Dithering of the clock signal may be performed, as described above, by periodically enabling and disabling a root clock-gating circuit. The functional units of an IC may be determined to be in an idle state responsive to a lack of activity for a predetermined period of time. An expectation of idleness may be determined when certain conditions occur in which no forward progress in processing data may occur until another condition is satisfied. Such a condition may include the satisfying of a request for data from a system memory or a response to a query from a processor core to a peripheral device. In such cases, the functional units of the IC may be idle during the latency period until the corresponding request is satisfied.

Once the request is satisfied, or once another condition occurs that invokes a condition to which the IC is responsive (e.g., an interrupt request, a request from an external unit to a processor core, etc.), a wakeup signal may be generated (block 620, yes). Assertion of the wakeup signal may cause the termination of the dithering mode and the restoration of the operating clock signal to its full frequency and duty cycle without any substantial delay (save for inherent propagation delays in various circuits). More particularly, the termination of the dithering mode may occur without waiting for the current cycle of the dithered operating clock signal to complete. Moreover, the termination of the dithering mode may occur at any point in the cycle of the dithered clock signal.

If a wakeup signal is not generated for a specified time period (block 620, no), the root clock signal may be gated (block 630), thereby inhibiting the operating clock signal from being provided. The IC (or affected functional units thereof) may remain in a clock gated state until a subsequent wakeup signal occurs (block 620, yes).

Figure 7:
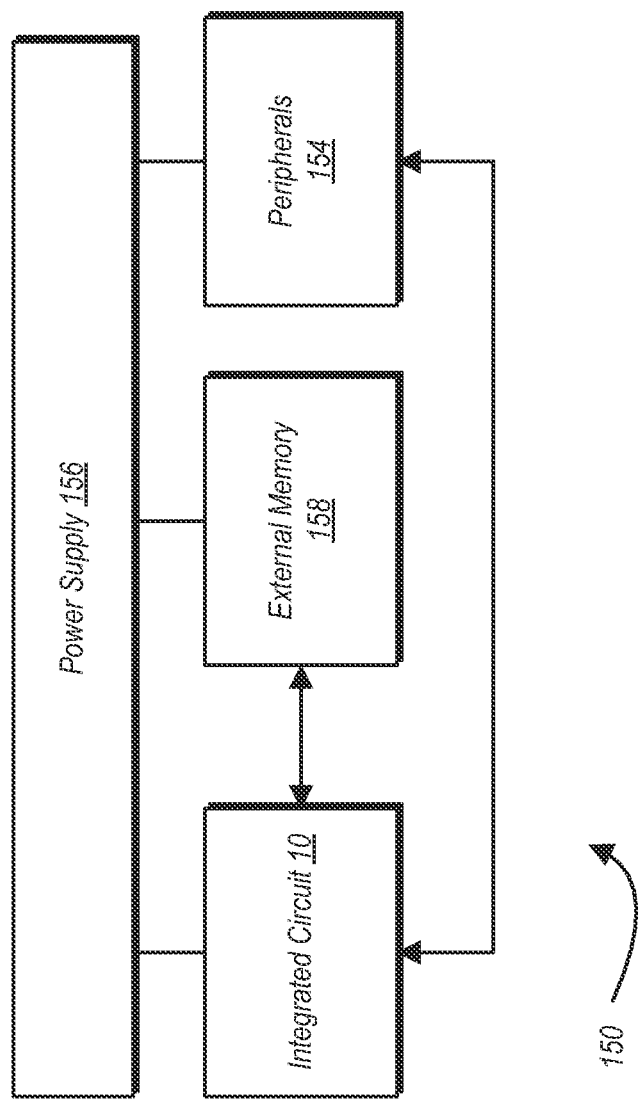
FIG. 7 is a block diagram of one embodiment of an exemplary system.

Exemplary System:

Turning next to FIG. 7, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. tablet computer, smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. Additionally, the peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. In some embodiments, external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. A system comprising:
a first functional unit;
a second functional unit;
a clock tree coupled to distribute a clock signal to a plurality of leaf-level clock gating units in each of the first and second functional units via correspondingly coupled ones of a plurality of regional clock-gating units, wherein the clock tree further includes a root level clock-gating unit coupled to distribute the clock signal to each of the regional clock-gating units; and
a control unit configured to cause the root level clock-gating unit provide the clock signal at a reduced duty cycle to responsive to determining that an activity level in each of the first and second functional units is below a threshold level, and wherein the control unit is configured to cause the root level clock-gating unit to restore a normal duty cycle of the clock signal responsive to receiving a wakeup signal, wherein the control unit is configured to cause a reduction of the duty cycle of the clock signal by enabling the root level clock-gating unit for one of every N cycles of the clock signal and inhibiting the root-level clock-gating unit of N−1 of every N cycles of the clock signal.

2. The system as recited in claim 1, wherein the root-level clock gating unit is configured to restore the normal duty cycle of the clock signal from the reduced duty cycle without waiting for a cycle of the clock signal to complete.

3. The system as recited in claim 1, wherein the control unit is configured to generate the wakeup signal based on one or more signals provided from one or more agents in the system.

4. The system as recited in claim 3, wherein the one or more signals provided from the one or more agents of the system are synchronized to the clock signal operating at the normal duty cycle.

5. A method comprising:
distributing an operational clock signal at a first duty cycle to a first functional unit and a second functional unit, wherein said distributing is performed by a root level clock-gating unit, and wherein said distributing includes providing the operational clock signal to one or more regional clock-gating units and a plurality of leaf level clock-gating units in each of the first and second functional units;
receiving, at a control unit, indications that the first and second functional units are in a first idle state;
providing the operational clock signal at a reduced duty cycle responsive to the control unit receiving the indications that the first and second functional units are in a second idle state, wherein providing the operational clock signal at the reduced duty cycle comprises the control unit enabling the root level clock gating-unit for one of every N cycles of a root clock signal, and inhibiting the root level clock-gating unit for N−1 of every N cycles of the root clock signal; and
restoring the operational clock signal to a normal duty cycle responsive to the control unit receiving a wakeup signal.

6. The method as recited in claim 5, further comprising the control unit enabling the root level clock-gating unit for N of every N cycles of the root clock signal if providing the operational clock signal at the normal duty cycle.

7. The method as recited in claim 5, further comprising:
synchronizing to the root clock signal to at least one indication received from an agent coupled to communicate with at least one of the first and second functional units;
generating the wakeup signal responsive to receiving the at least one indication;
the control unit asserting an enable signal to the root level clock-gating unit responsive to receiving the wakeup signal, wherein the enable signal; and
restoring the operational clock signal to the normal duty cycle without waiting for the operational signal to complete a full cycle in the reduced duty cycle.

8. The method as recited in claim 5, further comprising clock gating the first and second functional units responsive to the control unit receiving indications that the first and second functional units are in a second idle state.

9. An integrated circuit comprising:
a first processor core;
a second processor core;
a clock tree having a plurality of leaf level clock-gating circuits, a plurality of regional clock-gating circuits, and a root clock-gating circuit, wherein the root clock-gating circuit is coupled to distribute an operating clock signal to regional clock-gating circuits in each of the first and second processor cores, and wherein each of the regional clock-gating circuits is configured to distribute to correspondingly coupled leaf level clock-gating circuits in their respectively coupled processor cores; and
a controller configured to cause the root clock-gating circuit to provide the operating clock signal at a reduced duty cycle responsive to an activity level in each of the first and second processor cores falling below a first threshold, and further configured to cause the root clock-gating circuit to restore the operating clock signal to a normal duty cycle responsive to one or more externally received requests, wherein the controller is configured to cause a reduction of the duty cycle of the clock signal by enabling the root level clock-gating unit for one of every N cycles of the clock signal and inhibiting the root-level clock-gating unit of N−1 of every N cycles of the clock signal.

10. The integrated circuit as recited in claim 9, wherein the controller is configured cause the root level clock-gating circuit to restore the normal duty cycle of the operating clock signal from the reduced duty cycle without waiting for a cycle of the operating clock signal to complete.

11. The integrated circuit as recited in claim 9, further comprising a clock generation circuit configured to generate a root clock signal and coupled to provide the root clock signal to the root level clock-gating circuit at the normal duty cycle and a first frequency.

12. The integrated circuit as recited in claim 11, wherein the operating clock signal has an effective frequency equal to a second frequency less than the first frequency when provided at the reduced duty cycle by the root level clock-gating circuit.

13. The integrated circuit as recited in claim 9, further comprising:
a level two (L2) cache coupled to each of the first and second processor cores, wherein the L2 cache includes at least one of the plurality of regional clock-gating units; and
an interface unit coupled to the first and second processor cores and the L2 cache, wherein the interface unit includes at least one of the plurality of regional clock-gating units and a subset of the plurality of leaf level clock-gating units.

14. A method comprising:
providing, through a clock tree, a first clock signal to each of a plurality of functional units, wherein the clock tree includes a root clock gating circuit, a plurality of regional clock-gating circuits implemented in each of the plurality of functional units, and a plurality of leaf level clock-gating circuits;
monitoring respective activity levels of each of the plurality of functional units;
reducing a duty cycle of the first clock signal responsive to determining that each of the plurality of functional units are in a first idle state, wherein said reducing comprises enabling the root clock-gating circuit to provide the first clock signal on one of every N cycles of a received second clock signal; and
restoring a normal duty cycle of the first clock signal responsive to an external request to communicate with one of the plurality of functional units, wherein said restoring comprises enabling the root clock-gating circuit to provide the first clock signal on N of every N cycles of the second clock signal irrespective of whether the first clock signal has completed a current cycle.

15. The method as recited in claim 14, wherein reducing the duty cycle of the first clock signal comprises reducing an effective frequency of the first clock signal.

16. The method as recited in claim 14, further comprising the root clock-gating circuit inhibiting the second clock signal responsive to determining that the first and second functional units are in a second idle state.

17. The method as recited in claim 14, further comprising a clock generation circuit providing the second clock signal to the root clock-gating circuit, wherein a frequency and duty cycle of the first and second clock signals are equal if the root clock-gating circuit is held in an enabled state.

18. The method as recited in claim 14, further comprising:
inhibiting the first clock signal at one or more of the plurality of leaf level clock-gating circuits; and
inhibiting the first clock signal at one or more of the plurality of regional clock-gating circuits.

19. A system comprising:
one or more processor cores;
an interface unit configured to interface the one or more processor cores to a remainder of the system;
a clock tree coupled to distribute an operating clock signal to one or more processor cores and the interface unit, wherein the clock tree includes multiple levels, and wherein a leaf level of the clock tree includes a plurality of leaf clock gaters configured to gate the operating clock signal at the leaf level, and wherein an intermediate level of the clock tree includes a plurality of regional clock gaters configured to gate a region of the clock tree; and
a dithering control unit coupled to a root level of the clock tree and configured to dither the clock signal at the root level responsive to activity levels in the one or more processor cores and the interface unit, wherein the dithering control unit is coupled to receive a plurality of signals from the remainder of the system and to generate a wakeup signal responsive to the plurality of signals, wherein the dithering control unit is configured to terminate clock dithering responsive to the wakeup signal irrespective of whether or not a current cycle of the operating clock signal is complete, wherein the dithering control unit is configured to dither the operating clock signal by enabling the root clock gater for one of every N cycles of the root clock signal and disable the root clock gater for N−1 of every N cycles of the root clock signal.

20. The system as recited in claim 19, wherein the system further includes a root clock gater coupled to distribute the operating clock signal to each of the plurality of regional clock gaters.

21. The system as recited in claim 20, wherein the system further includes a clock generation circuit coupled to provide a root clock signal to the root clock gater.

22. The system as recited in claim 19, wherein the dithering control unit is configured to terminate dithering by enabling the root clock gater responsive to assertion of the wakeup signal, and wherein the root clock gater is configured to provide the operating clock signal at a duty cycle and frequency equivalent to that of the root clock signal when held in an enabled state.

* * * * *